United States Patent
Lee et al.

(10) Patent No.: US 9,691,469 B2
(45) Date of Patent: Jun. 27, 2017

(54) SEMICONDUCTOR MEMORY DEVICE AND OPERATING METHOD THEREOF

(71) Applicant: SK hynix Inc., Gyeonggi-do (KR)

(72) Inventors: Hyeng-Ouk Lee, Gyeonggi-do (KR); Seung-Chan Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 67 days.

(21) Appl. No.: 14/552,075

(22) Filed: Nov. 24, 2014

(65) Prior Publication Data

US 2015/0371700 A1    Dec. 24, 2015

(30) Foreign Application Priority Data

Jun. 18, 2014    (KR) .................. 10-2014-0074174

(51) Int. Cl.
*G11C 11/406*    (2006.01)

(52) U.S. Cl.
CPC .............................. *G11C 11/40626* (2013.01)

(58) Field of Classification Search
CPC .................................................... G11C 11/406
USPC ......................................................... 365/222
See application file for complete search history.

(56) References Cited

U.S. PATENT DOCUMENTS

| 7,583,553 | B2* | 9/2009 | Mori | G11C 7/04 365/212 |
| 8,804,418 | B1* | 8/2014 | Shih | G11C 16/10 365/185.02 |
| 2003/0081486 | A1* | 5/2003 | Yamauchi | G11C 7/04 365/222 |
| 2005/0237837 | A1* | 10/2005 | Oh | G11C 11/406 365/222 |
| 2008/0084738 | A1* | 4/2008 | Philipp | G11C 11/5678 365/185.03 |
| 2011/0173395 | A1* | 7/2011 | Bhattacharjee | G05D 23/19 711/135 |
| 2015/0036445 | A1* | 2/2015 | Yoshida | G11C 11/40626 365/222 |
| 2015/0371699 | A1* | 12/2015 | Lee | G11C 11/40626 365/189.07 |

FOREIGN PATENT DOCUMENTS

KR    1020080066249    7/2008

* cited by examiner

*Primary Examiner* — Min Huang
(74) *Attorney, Agent, or Firm* — IP & T Group LLP

(57) ABSTRACT

A semiconductor memory device includes an oscillating signal generation section suitable for generating an oscillation signal oscillating with a period, which is defined by a predetermined temperature-period function, a period control section suitable for controlling the period of the oscillation signal according to a combination of two or more predetermined temperature-period functions, which are different from one another, in response to a refresh characteristic information, and a memory cell array suitable for performing a refresh operation in response to the oscillation signal.

12 Claims, 5 Drawing Sheets

SEMICONDUCTOR MEMORY DEVICE AND OPERATING METHOD THEREOF

CROSS-REFERENCE TO RELATED APPLICATIONS

The present application claims priority of Korean Patent Application No. 10-2014-0074174, filed on Jun. 18, 2014, which is incorporated herein by reference in its entirety.

BACKGROUND

1. Field

Various exemplary embodiments of the present invention relate to a semiconductor design technology, and more particularly, to a semiconductor memory device capable of operating refresh operations according to temperature.

2. Description of the Related Art

Generally, a semiconductor memory device such as Double Data Rate Synchronous Dynamic Random Access Memory (DDR SDRAM) includes a plurality of memory banks for storing data, and each of the plurality of memory banks has more than en-million memory cells, Each of the memory cells comprises a cell capacitor and a cell transistor, and the semiconductor memory device stores data by charging and discharging the cell capacitor.

Ideally, the amount of charge stored in the cell capacitor is supposed to remain the same. However, in reality, the amount of charge stored in the cell capacitor changes due to a voltage difference between the peripheral circuits. That is, there may be outflow of charge from the charged cell capacitor, or there may be inflow of charge when the cell capacitor is discharged. A change in the amount of charge correlates to a change in the data stored in the cell capacitor, and therefore a loss of charge may result in a loss of data. Semiconductor memory devices perform refresh operations to prevent a loss of data due to unintended changes in cell capacitor charges.

FIG. 1 is a block diagram illustrating an existing semiconductor memory device.

Referring to FIG. 1, the semiconductor memory device includes an oscillating signal generation section 110, a refresh signal generation section 120, a word line control section 130, and a memory cell array 140.

The oscillating signal generation section 110 generates an oscillation signal OSC with a predetermined period, in response to a refresh command signal CMD_REF. The refresh signal generation section 120 receives the oscillation signal OSC and generates a refresh signal INN_REF, which is enabled with the predetermined period of the oscillation signal OSC. The word line control section 130 controls enablement of a plurality of word lines through word line signals WL in response to the refresh signal INN_REF. The memory cell array 140 performs the refresh operation in response to the word line signals WL.

Semiconductor memory device deteriorate based on how long they are in service and how much use it has received. That is, semiconductor memory devices degrade as they are written, read from, and they also degrade simply due to the passage of time Eventually they get to the point where they need to be discarded. As the semiconductor memory device deteriorates, refresh operations are likely to malfunction. The malfunction of refresh operations may be the direct cause of reduced reliability of stored data. Therefore, it is necessary to adapt the refresh operations to the possibly deteriorated condition of the semiconductor memory device.

SUMMARY

Various embodiments of the present invention are directed to a semiconductor memory device capable of performing refresh operations according to the status thereof.

In accordance with an embodiment of e present invention, a semiconductor memory device includes an oscillating signal generation section suitable for generating an oscillation signal oscillating with a period, which is defined by a predetermined temperature-period function; a period control section suitable for controlling the period of the oscillation signal according to a combination of two or more predetermined temperature-period functions, which are different from one another, in response to a refresh characteristic information; and a memory cell array suitable for performing a refresh operation in response to the oscillation signal.

The refresh characteristic information may correspond to a characteristic of a refresh operation of a memory cell.

The oscillating signal generation section may generate the oscillation signal through charging and discharging operations, and the period control section may comprise a plurality of discharge units for the discharging operation.

Each of the plurality of discharge units may have a predetermined temperature-current characteristic, and the period control section may control the predetermined temperature-current characteristics of the plurality of discharge units for the combination of the predetermined temperature-period functions in response to the refresh characteristic information.

The period control section selectively may enable the plurality of discharge units in response to the refresh characteristic information.

Each of the predetermined temperature-period functions may be a continuous function.

In accordance with an embodiment of the present invention, an operating method of a semiconductor memory device includes setting one or more function transition points according to a refresh characteristic information; combining two or more temperature-period functions, which are different from one another, with reference to the function transition points; setting a period of a refresh operation according to the combined temperature-period function; and performing the refresh operation on a memory cell array with the set period.

The refresh characteristic information may correspond to a characteristic of a refresh operation of a memory cell.

The combined temperature-period function may have two or more temperature sections defined by the function transition points, and the combined temperature-period function may have each of the two or more temperature-period functions, which are different from one another, in each of the temperature sections.

In accordance with an embodiment of the present invention, a semiconductor memory system includes a controller suitable for controlling a plurality of semiconductor memory devices; and the plurality of semiconductor memory devices, each of which sets one or more function transition points in response to an information about disposition relationships between the controller and the semiconductor memory device, and sets a period of a refresh operation according to a combination of two or more predetermined temperature-period functions, which are different from one another, with reference to the function transition points.

The controller and each of the plurality of semiconductor memory devices may be separately disposed, and the function transition points of the plurality of semiconductor memory devices may be different from one another.

Each of the plurality of semiconductor memory devices may comprise a characteristic information generation part suitable for generating a refresh characteristic information in response to the information about disposition relationships between the controller and the semiconductor memory device; and a refresh operation part suitable for performing the refresh operation in response to the refresh characteristic information.

The refresh operation part may comprise an oscillating signal generation section suitable for generating an oscillation signal oscillating with a period, which is defined by a predetermined temperature-period function; a period control section suitable for controlling the period of the oscillation signal according to the combination of two or more predetermined temperature-period functions, which are different from one another, in response to the refresh characteristic information; and a memory cell array suitable for performing the refresh operation in response to the oscillation signal.

The plurality of semiconductor memory devices may include a first semiconductor memory device and a second semiconductor memory device, and the first semiconductor memory device is disposed with a first space with reference to the controller, and the second semiconductor memory device is disposed with a second space with reference to the controller, wherein when the second space is greater than the first space, one of the function transition points of the first semiconductor memory device is set to a first temperature, and one of the function transition points of the second semiconductor memory device is set to a second temperature, which is higher than the first temperature.

The combined temperature-period function may have two or more temperature sections defined by the function transition points, and the combined temperature-period function may have each of the two or more temperature-period functions, which are different from one another, in each of the temperature sections.

In accordance with an embodiment of the present invention, a semiconductor memory device includes a detection part suitable for detecting a number of accesses to the semiconductor memory device; a characteristic information generation part suitable for generating a refresh characteristic information in response to an output signal of the detection part; and a refresh operation part suitable for setting one or more function transition points in response to the refresh characteristic information, and performing a refresh operation according to a combination of two or more predetermined temperature-period functions, which are different from one another, with reference to the function transition point.

The detection part may detect the number of accesses through a temperature of the semiconductor memory device.

The detection part may detect the number of accesses through an input number of a command signal inputted to the semiconductor memory device.

The refresh operation part may comprise an oscillating signal generation section suitable for generating an oscillation signal oscillating with a period, which is defined by a predetermined temperature-period function; a period control section suitable for controlling the period of the oscillation signal according to the combination of two or more predetermined temperature-period functions, which are different from one another, in response to the refresh characteristic information, and a memory cell array suitable for performing the refresh operation in response to the oscillation signal.

The combined temperature-period function may have two or more temperature sections defined by the function transition points, and the combined temperature-period function may have each of the two or more temperature-period functions, which are different from one another, in each of the temperature sections.

In accordance with the embodiments of the present invention, a semiconductor memory device may stably maintain data stored therein by performing refresh operations according to the status thereof.

DETAILED DESCRIPTION

Figure 1:
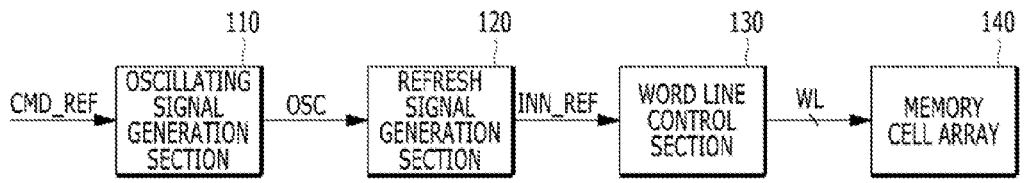
FIG. 1 is a block diagram illustrating an existing semiconductor memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and, in some instances, proportions may have been exaggerated in order to clearly illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on"

means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to where the first layer is formed directly on the second layer or the substrate but also to where a third layer exists between the first layer and the second layer or the substrate.

Figure 2:
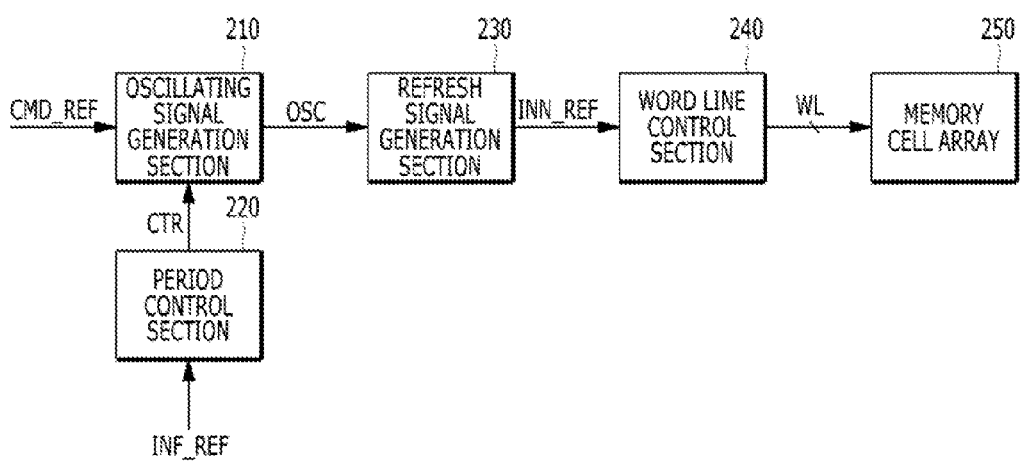
FIG. 2 is a block diagram illustrating a semiconductor memory device in accordance with an exemplary embodiment of the present invention.

FIG. 2 is a block diagram illustrating a semiconductor memory device in accordance with an exemplary embodiment of the present invention.

Referring to FIG. 2, the semiconductor memory device may include an oscillating signal generation section 210, a period control section 220, a refresh signal generation section 230, a word line control section 240, and a memory cell array 250.

The oscillating signal generation section 210 may generate an oscillation signal OSC, oscillating with a predetermined period, in response to a refresh command signal CMD_REF. The refresh command signal CMD_REF may come from an external controller or an internal circuit, and may represent a command to perform a refresh operation.

The period control section 220 may generate a period control signal CTR in response to refresh characteristic information INF_REF. The refresh characteristic information INF_REF may represent a characteristic of refresh operation of the memory cell array 250. A period of refresh operation of the memory cell array 250 may be determined according to the refresh characteristic information INF_REF. The characteristic of refresh operation may be determined by various factors, which will be described later in detail.

The oscillating signal generation section 210 may control a period of the oscillation signal OSC according to a temperature-period function defined by the period control signal CTR. The period control signal CTR may control the period of the oscillation signal OSC through various temperature-period functions, which will be described with reference to FIG. 5. The refresh signal generation section 230 may receive the oscillation signal OSC, and generate a refresh signal INN_REF by adjusting the pulse duration of the oscillation signal OSC. The oscillation signal OSC and the refresh signal INN_REF may have the same period.

The word line control section 240 may control enablement of a plurality of word lines through word line signals WL in response to the refresh signal INN_REF. The memory cell array 250 may perform the refresh operation on each of the plurality of word lines enabled by the word line signals WL.

In accordance with the exemplary embodiment of the present invention, the semiconductor memory device may generate refresh signals INN_REF having various periods defined by various temperature-period functions according to the refresh characteristic information INF_REF, and may perform a refresh operation in response to a refresh signal INN_REF.

Figure 3:
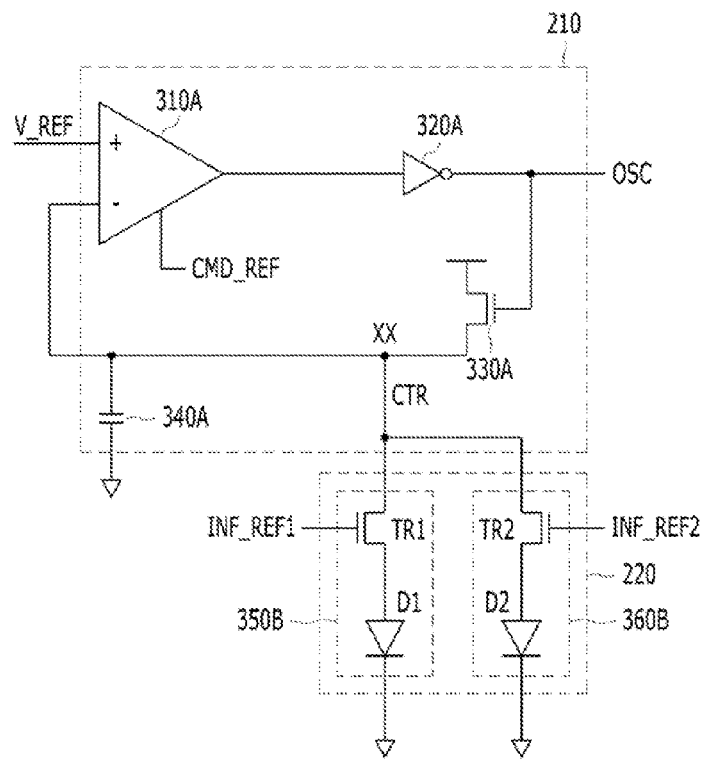
FIG. 3 is a circuit diagram illustrating an oscillating signal generation section and a period control section shown in FIG. 2.

FIG. 3 is a circuit diagram illustrating the oscillating signal generation section 210 and the period control section 220 shown in FIG. 2.

Referring to FIG. 3, the oscillating signal generation section 210 may control the period of the oscillation signal OSC according to a temperature-period function controlled by the period control signal CTR. The oscillating signal generation section 210 may include a comparison unit 310A, which is enabled in response to the refresh command signal CMD_REF, an inversion unit 320A, which buffers and outputs an output signal of the comparison unit 310A as the oscillation signal OSC, a power supply unit 330A, which charges a charge unit 340A in response to the oscillation signal OSC, and the charge unit 340A, which stores charges provided by the power supply unit 330A.

The period control section 220 may generate the period control signal CTR in response to the refresh characteristic information INF_REF. The refresh characteristic information INF_REF may include first refresh characteristic information INF_REF1, and second refresh characteristic information INF_REF2. The period control section 220 may include a first discharge unit 350B, which defines the period of the oscillation signal OSC as a first temperature-period function in response to the first refresh characteristic information INF_REF1, a second discharge unit 360B, which defines the period of the oscillation signal OSC as a second temperature-period function in response to the second refresh characteristic information INF_REF2. The first and second temperature-period functions will be described with reference to FIG. 4.

For reference, the oscillating signal generation section 210 may be exemplarily implemented with a circuit generating the oscillation signal OSC through charging and discharging operations. Also, the period control section 220 may be exemplarily implemented with a circuit for the discharging operation. Therefore, the period control signal CTR outputted from the period control section 220 may correspond to sink current for the discharging operation. That is, the period control signal CTR may be current sinking into a node XX.

Hereinafter, the first and second discharge units 350B and 360B will be described.

The first discharge unit 350B may include a first diode D1 having a first temperature-current characteristic, and a first transistor TR1 for electrically coupling the first diode D1 and the node XX in response to the first refresh characteristic information INF_REF1. The first temperature-current characteristic may indicate current that the first diode D1 sinks according to the temperature of the first diode D1, which will be described with reference to FIG. 4.

The second discharge unit 350B may include a second diode D2 having a second temperature-current characteristic, and a second transistor TR2 for electrically coupling the second diode D2 and the node XX in response to the second refresh characteristic information INF_REF2. The second temperature-current characteristic may indicate current that the second diode D2 sinks according to the temperature of the second diode D2. The first and second temperature-current characteristics may be the same or different from each other.

For reference, when the first and second temperature-current characteristics are the same as each other, the temperature-current characteristic of the period control section 220 may be varied through adjusting the number of enabled discharged units from the discharge units 350B and 360B. On the other hand, when the first and second temperature-current characteristics are different from each other, the temperature-current characteristic of the period control section 220 may be varied through enabling each of a plurality of the discharge units 350B and 360B.

Hereinafter, an example will be described where the first and second temperature-current characteristics are different from each other.

In accordance with an exemplary embodiment of the present invention, the semiconductor memory device may change the temperature-current characteristics in response to the first and second refresh characteristic information INF_REF1 and INF_REF2, The change of the temperature-current characteristic may mean the change of the period of the oscillation signal OSC according to temperature, and therefore may mean the change of the period of the refresh signal INN_REF according to temperature. In accordance with an exemplary embodiment of the present invention, the semiconductor memory device may change the period of the refresh signal INN_REF according to the first and second refresh characteristic information INF_REF1 and INF_REF2.

For reference, a large amount of sinking current to the node XX may indicate a short time for the node XX to be totally discharged, and therefore may mean a short period of the oscillation signal USC. On the other hand, a small amount of sinking current to the node XX may indicate a large amount of time for the node XX to be totally discharged, and therefore may mean a long period of the oscillation signal USC. That is, the temperature-current characteristic may be transformed into a temperature-period function. Hereinafter, the first and second temperature-current characteristics and corresponding temperature-period functions will be described.

Figure 4:
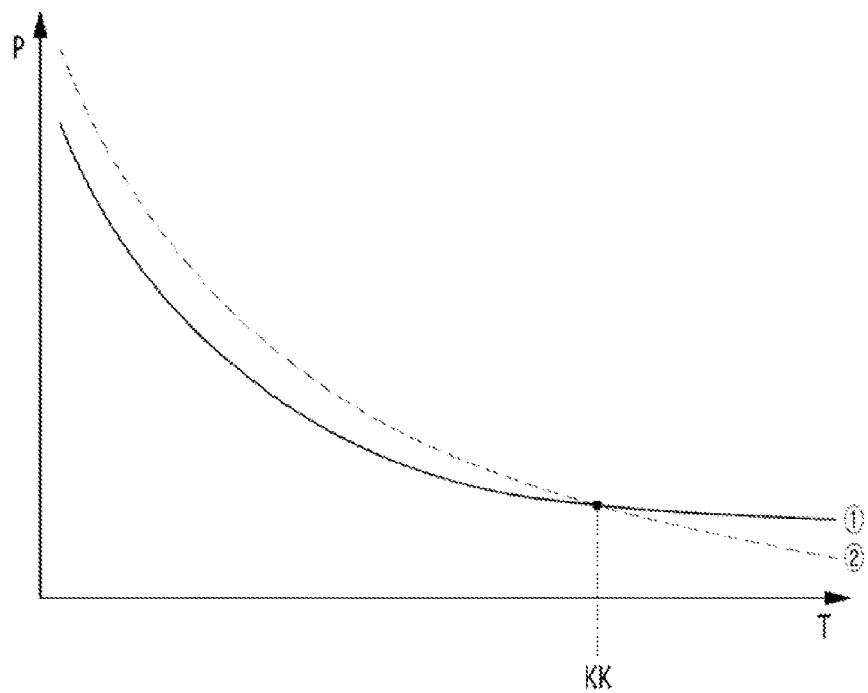
FIG. 4 is a graph illustrating first and second temperature-current characteristics of an oscillating signal generation section and a period control section shown in FIG. 3.

FIG. 4 is a graph illustrating first and second temperature-current characteristics of the oscillating signal generation section 210 and the period control section 220 shown in FIG. 3. The X axis may represent the temperature T, and Y axis may represent the period P of the oscillation signal USC, that is, the period P of the refresh signal INN_REF.

FIG. 4 shows the first function "1" corresponding to the first temperature-current characteristic, and the second function "2" corresponding to the second temperature-current characteristic. As shown in FIG. 4, the period P of the refresh signal INN_REF may become longer as the temperature T becomes lower, and the period P of the refresh signal INN_REF may become shorter as the temperature T becomes higher, in the first function "1" and the second function "2". To be specific, the slope of the first function "2" is greater than the slope of the second function "2" before the point KK of the temperature T, and the slope of the first function "1" is smaller than the slope of the second function "2" after the point KK of the temperature T. The slope of the first function "1" and the second function "2" may be defined according to the characteristics of the first and second diodes D1 and D2 described above with reference to FIG. 3.

Figure 5:
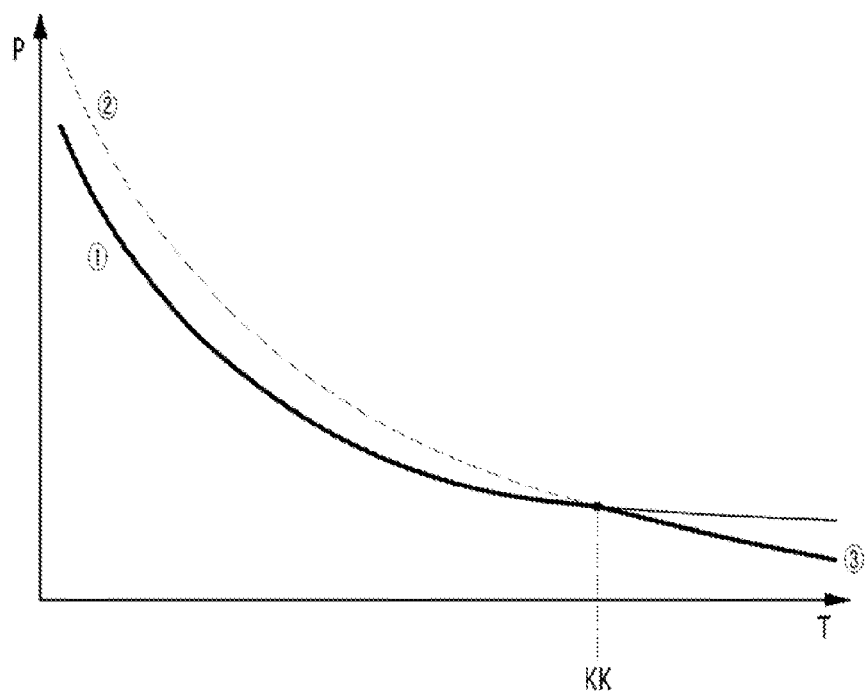
FIG. 5 is a graph illustrating a circuit operation according to first and second refresh characteristics.

FIG. 5 is a graph illustrating a circuit operation according to the first and second refresh characteristics INF_REF1 and INF_REF2. The X axis may represent the temperature T, and the Y axis may represent the period P of the oscillation signal OSC, that is, the period P of the refresh signal INN_REF.

FIG. 5 shows as an example where the first refresh characteristic information INF_REF1 is enabled before the point KK of the temperature T, and the second refresh characteristic information INF_REF2 is enabled after the point KK of the temperature T. In this case, the temperature-period function of the period control section 220 may be a third function "3". That is, the third function "3" may be a continuous function, which corresponds to the first function '1' before the point KK of the temperature T, and corresponds to the second function "2" after the point KK of the temperature T. The point KK of the temperature T may be referred to as a function transition point since the third function "3" is defined by the first function "1" and the second function "2" with reference to the point KK of the temperature T. The period of the oscillation signal OSC, that is, the period of the refresh signal INN_REF may be the third function "3", which is a combination of different functions (the first function "1" and the second function "2") with reference to the function transition point KK.

In accordance with an exemplary embodiment of the present invention, the semiconductor memory device may control the period of the refresh signal INN_REF by combining different functions (the first function "1" and the second function "2") indicated by the first refresh characteristic information INF_REF1 and the second refresh characteristic information INF_REF2.

Figure 6:
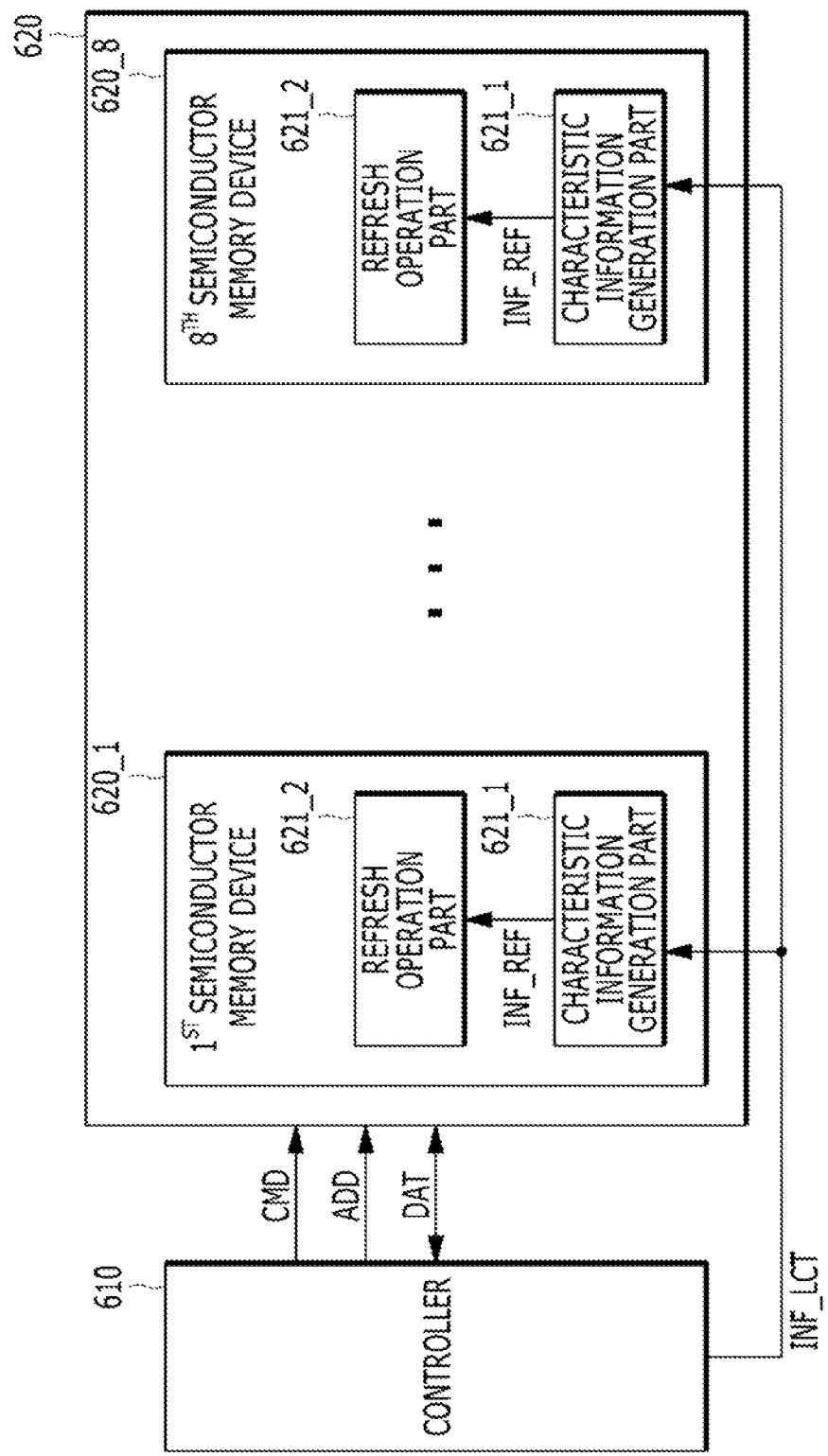
FIG. 6 is a block diagram illustrating a semiconductor memory system in accordance with an exemplary embodiment of the present invention.

FIG. 6 is a block diagram illustrating a semiconductor memory system in accordance with an exemplary embodiment of the present invention.

Referring to FIG. 6, the semiconductor memory system may include a controller 610, and a plurality of semiconductor memory devices 620. The plurality of semiconductor memory devices 620 may be a Dual In-line Memory Module (DIMM).

The controller 610 may provide a command signal CMD and an address signal ADD, and may receive data DAT through read and write operations according to the command signal CMD.

The plurality of semiconductor memory devices 620 may perform read and write operations under the control of the controller 610, and may include first to eighth semiconductor memory devices 620_1 to 620_8. Although the disposition of the controller 610 and the first to eighth semiconductor memory devices 620_1 to 620_8 may be different according to design, it is assumed that the first semiconductor memory device 620_1 is disposed closer to the controller 610 than the eighth semiconductor memory device 620_8. That is, when the first semiconductor memory device 620_1 is disposed with a first space with reference to the controller 610, and the eighth semiconductor memory device 620_8 is disposed with a second space with reference to the controller 610, the second space corresponding to the eighth semiconductor memory device 620_8 may be greater than the first space corresponding to the first semiconductor memory device 620_1.

Each of the first to eighth semiconductor memory devices 620_1 to 620_8 may include a characteristic information generation part 621_1 and a refresh operation part 621_2.

The characteristic information generation part 621_1 may receive location information INF_LCT corresponding to the space of each of the first to eighth semiconductor memory devices 620_1 to 620_8, and may generate the refresh characteristic information INF_REF. As described above, the refresh characteristic information INF_REF may control the function transition point (exemplarily noted as "KK" in FIGS. 4 and 5) of corresponding semiconductor memory devices, and therefore may determine the periods of refresh operations of corresponding memory cell arrays.

The refresh operation part 621_2 may perform the refresh operation with the period of the refresh characteristic information INF_REF, and may have the sections described above with reference to FIG. 2. That is, the refresh operation part 621_2 may include the oscillating signal generation section 210, the period control section 220, the refresh signal generation section 230, the word line control section 240, and the memory cell array 250. Particularly, the period control section 220 may set the function transition point according to the refresh characteristic information INF_REF, and set the period of the refresh operation according to a combined temperature-period function, combined from the temperature-period functions differently defined with reference to the function transition point. The set period of the refresh operation may be used for controlling the refresh operation of the memory cell array 250.

The temperature of the semiconductor memory system including the controller 610 and the first to eighth semiconductor memory devices 620_1 to 620_8 rises to at least 70° C. and even up to 120° C. when the semiconductor memory system is in operation. When the temperature of the controller 610 rises, the temperature may exert an influence on the first to eighth semiconductor memory devices 620_1 to 620_8, which are disposed around the controller 610. That is, the high temperature of the controller 610 may raise the temperature of the first to eighth semiconductor memory devices 620_1 to 620_8. When the temperature of a semiconductor memory device rises unexpectedly, it may cause increased deterioration.

The influence of high temperatures of the controller 610 on the first to eighth semiconductor memory devices 620_1 to 620_8 may vary according to the space between the controller 610 and each of the first to eighth semiconductor memory devices 620_1 to 620_8. The closer to the controller 610 the semiconductor memory device is disposed, the more influence the temperature of the controller 610 may exert on the semiconductor memory device, and the semiconductor memory device may seriously deteriorate. The first semiconductor memory device 620_1 may be an example of this. The farther away the controller 610 is from a semiconductor memory device, the less influence the temperature of the controller 610 may exert, and the semiconductor memory device may deteriorate less than those positioned closer to the controller 610. The eighth semiconductor memory device 620_8 may be an example of this.

In accordance with an exemplary embodiment of the present invention, the semiconductor memory system may control the function transition point according to the disposition relationship between the controller 610 and the first to eighth semiconductor memory devices 620_1 to 620_8, and may allow each of the first to eighth semiconductor memory devices 620_1 to 620_8 to set the period of the refresh operation according to the function transition point.

Figure 7:
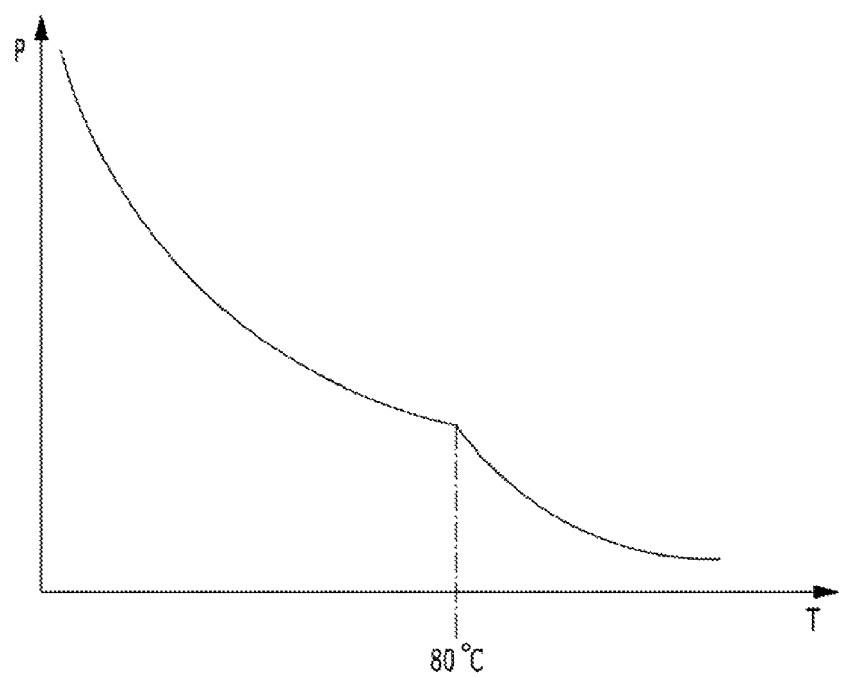
FIG. 7 is a graph illustrating characteristics of refresh operations of a plurality of semiconductor memory devices shown in FIG. 6.
Figure 8:
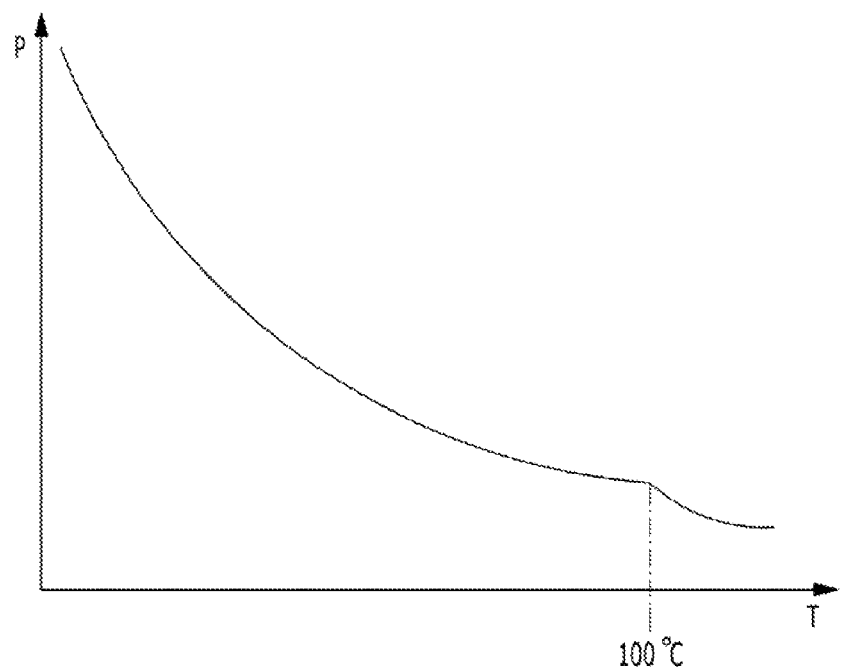
FIG. 8 is a graph illustrating characteristics of refresh operations of a plurality of semiconductor memory devices shown in FIG. 6.

FIGS. 7 and 8 are graphs illustrating characteristics of refresh operations of the plurality of semiconductor memory devices 620_1 to 620_8 shown in FIG. 6.

FIG. 7 illustrates the characteristic of refresh operation of the first semiconductor memory device 620_1. FIG. 8 illustrates the characteristic of refresh operation of the eighth semiconductor memory device 620_8. As described above, the first semiconductor memory device 620_1, which is disposed relatively closer to the controller 610, deteriorate relatively more serious than the eighth semiconductor memory device 620_8, which is disposed relatively farther to the controller 610. Therefore, the function transition point of the first semiconductor memory device 620_1 may be set to 80° C., and the function transition point of the eighth semiconductor memory device 620_8 may be set to 100° C., which is higher than the function transition point of the first semiconductor memory device 620_1.

When the function transition point of the first semiconductor memory device 620_1 is set higher than 80° C., the first semiconductor memory device 620_1 may deteriorate because of the high temperature of the controller 610, which means that the first semiconductor memory device 620_1 requires a shorter refresh operation period in order to prevent deterioration of the memory cell array, but the first semiconductor memory device 620_1 cannot perform the refresh operation with the shorter period with the function transition point higher than 80° C. which may mean a loss of data stored in the memory cell array.

For reference, it is described with reference to FIG. 3 that the circuit and method for combining different functions with reference to the function transition point may be controlled by a discharging operation. Also, the function transition point and the function may be defined by varying the value of the diode described above with reference to FIG. 3. Therefore, the function transition point and control operation to the function related to FIGS. 7 and 8 will be omitted. Although FIGS. 7 and 8 show setting one function transition point of 80° C. and 100° C. for each of the first and eighth semiconductor memory devices 620_1 and 620_8 it is possible to set two or more function transition points for each of the semiconductor memory devices according to design. In this case, a plurality of the function transition points for each of the semiconductor memory devices may be set by controlling a number of the parallel diodes described above with reference to FIG. 3, or the size of the diodes described above with reference to FIG. 3.

Figure 9:
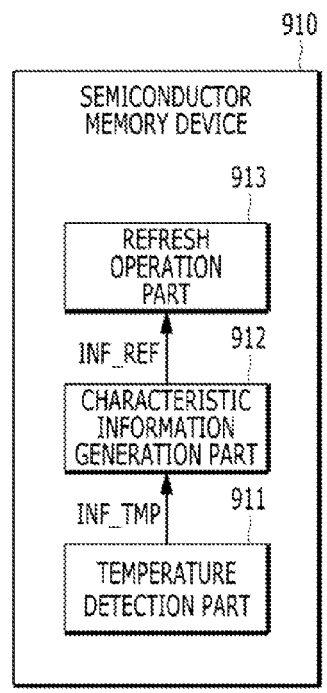
FIG. 9 is a block diagram illustrating semiconductor memory devices in accordance with an exemplary embodiment of the present invention.
Figure 10:
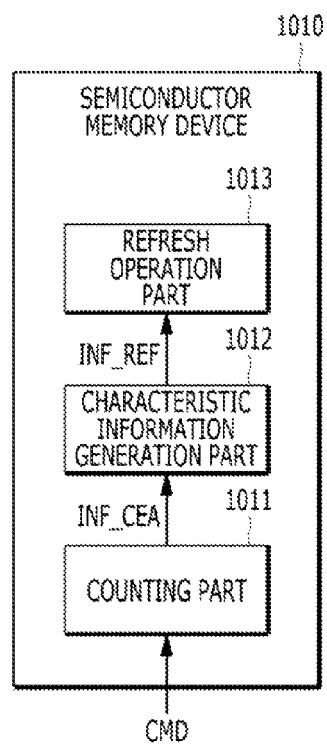
FIG. 10 is a block diagram illustrating semiconductor memory devices in accordance with an exemplary embodiment of the present invention.

The exemplary embodiments of the present invention have focussed on the fact that semiconductor memory devices deteriorate when their temperature rises. However, semiconductor memory devices may deteriorate due to various causes. Hereinafter, exemplary embodiments will be described that may set the function transition points by detecting deterioration factors, and may operate the refresh operations according to the set function transition points. For example, a semiconductor memory device may deteriorate when the semiconductor memory device gets accessed a lot. FIGS. 9 and 10 show semiconductor memory devices capable of detecting a large number of accesses, controlling the period of the refresh operations, and accordingly performing the refresh operation.

FIGS. 9 and 10 are block diagrams illustrating semiconductor memory devices in accordance with an exemplary embodiment of the present invention.

Referring to FIG. 9, the semiconductor memory device 910 may include a temperature detection part 911, a characteristic information generation part 912 and a refresh operation part 913.

The temperature detection part 911 may generate temperature information INF_TMP by detecting the temperature of the semiconductor memory device 910. The characteristic information generation part 912 may generate the refresh characteristic information INF_REF in response to the temperature information INF_TMP. The refresh operation part 913 may set the function transition point of the semiconductor memory device 910 in response to the refresh characteristic information INF_REF, and may perform the refresh operation according to the combined temperature-period function combined from the temperature-period functions differently defined with reference to the set function transition point. The refresh operation part 913 may have the sections described above with reference to FIG. 2. That is, the refresh operation part 621_2 may include the oscillating signal generation section 210, the period control section 220, the refresh signal generation section 230, the word line control section 240, and the memory cell array 250. Particularly, the period control section 220 may set the function transition point according to the refresh characteristic information INF_REF and set the period of the refresh operation according to combined temperature-period function combined from the temperature-period functions differently defined with reference to the function transition point. The set period of the refresh operation may be used for controlling the refresh operation of the memory cell array 250.

The semiconductor memory device 910 shown in FIG. 9 may detect the temperature and generate the temperature information INF_TMP. The temperature of a semiconductor memory device may become higher when the semiconductor memory device gets accessed a lot. The semiconductor memory device 910 shown in FIG. 9 may determine the amount of access through the temperature thereof. That is, high temperatures of a semiconductor memory device may indicate a large amount of accesses to the semiconductor memory device, and therefore may indicate deterioration of the semiconductor memory device. In this case, the function transition point may be set to a lower temperature as described above with reference to FIG. 7.

Referring to FIG. 10, the semiconductor memory device 1010 may include a counting part 1011, a characteristic information generation part 1012, and a refresh operation part 1013.

The counting part 1011 may generate counting value information INF_CEA by counting input numbers of the command signal CMD. The characteristic information generation part 1012 may generate the refresh characteristic information INF_REF in response to the counting value information INF_CEA. The refresh operation part 1013 may set the function transition point of the semiconductor memory device 1010 in response to the refresh characteristic information INF_REF, and may perform the refresh operation according to the combined temperature-period function combined from the temperature-period functions differently defined with reference to the set function transition point. The refresh operation part 1013 may have the sections described above with reference to FIG. 2. That is, the refresh operation part 621_2 may include the oscillating signal generation section 210, the period control section 220, the refresh signal generation section 230, the word line control section 240, and the memory cell array 250. Particularly, the period control section 220 may set the function transition point according to the refresh characteristic information INF_REF, and set the period of the refresh operation according to a combined temperature-period function, combined from the temperature-period functions differently defined with reference to the function transition point. The set period of the refresh operation may be used for controlling the refresh operation of the memory cell array 250.

The semiconductor memory device 1010 shown in FIG. 10 may count the input numbers of the command signal CMD and generate the counting value information INF_CEA. While the semiconductor memory device 910 shown in FIG. 9 may determine the deterioration thereof through the temperature thereof, the semiconductor memory device 1010 shown in FIG. 10 may determine the deterioration thereof through the input numbers of the command signal CMD. That is, the semiconductor memory device 1010 shown in FIG. 10 may determine the amount of access through the input numbers of the command signal CMD. In other words, a large number of inputs of the command signal CMD may mean a large amount of accesses to the semiconductor memory device, and therefore may indicate deterioration of the semiconductor memory device. In this case, the function transition point may be set to a lower temperature as described above with reference to FIG. 7.

In accordance with an exemplary embodiment of the present invention, the semiconductor memory device may determine the amount of access thereto by detecting the temperature thereof or the input numbers of the command signal, may set the function transition point according to the determination result, and may perform the refresh operation according to the combined temperature-period function combined from the temperature-period functions differently defined with reference to the set function transition point.

As described above, in accordance with an exemplary embodiment of the present invention, a semiconductor memory device may perform refresh operations by adjusting the function according to the refresh characteristics of the memory cell array.

The reliability of data stored in the semiconductor memory device may be elevated by stably performing the refresh operations.

While the present invention has been described with respect to specific embodiments, it will be apparent to those skilled in the art that various changes and modifications may be made without departing from the spirit and scope of the invention as defined in the following claims.

What is claimed is:

1. A semiconductor memory device comprising:
    an oscillating signal generation section suitable for generating an oscillation signal oscillating with a period, which is defined by a predetermined temperature-period function;
    a period control section suitable for controlling the period of the oscillation signal according to a combined temperature-period function which is combined two or more predetermined temperature-period functions, which are different from one another, in response to a refresh characteristic information; and
    a memory cell array suitable for performing a refresh operation in response to the oscillation signal,
    wherein the combination of two or more predetermined temperature-period functions has two or more temperature sections defined by the function transition points,
    wherein the combined temperature-period function has each of the two or more temperature-period functions including a first function and a second function, which are different from one another, in each of the temperature sections,
    wherein the combined temperature-period function corresponds to the first function before a function transition point, and corresponds to the second function after the function transition point,
    wherein the period control section comprises a plurality of discharge units,
    wherein each of the discharge units includes a diode and a transistor for electrically coupling to the oscillating signal generation section for defining the slopes of the first function and the second function.

2. The semiconductor memory device of claim 1, wherein the refresh characteristic information corresponds to a characteristic of a refresh operation of a memory cell.

3. The semiconductor memory device of claim 1, wherein the oscillating signal generation section generates the oscillation signal through charging and discharging operations.

4. The semiconductor memory device of claim 1, wherein each of the plurality of discharge units has a predetermined temperature-current characteristic, and wherein the period control section controls the predetermined temperature-current characteristics of the plurality of discharge units for the combination of the predetermined temperature-period functions in response to the refresh characteristic information.

5. The semiconductor memory device of claim 1, wherein the period control section selectively enables the plurality of discharge units in response to the refresh characteristic information.

6. The semiconductor memory device of claim 1, wherein each of the predetermined temperature-period functions is a continuous function.

7. A semiconductor memory system comprising:
a controller suitable for controlling a plurality of semiconductor memory devices; and
the plurality of semiconductor memory devices, each of which sets one or more function transition points in response to an information about disposition relationships between the controller and the semiconductor memory device, and sets a period of a refresh operation according to a combination of two or more predetermined temperature-period functions, which are different from one another, with reference to the function transition points,
wherein the combined temperature-period function has two or more temperature sections defined by the function transition points, and
wherein the combined temperature-period function has each of the two or more temperature-period functions including a first function and a second function, which are different from one another, in each of the temperature sections,
wherein the combined temperature-period function corresponds to the first function before a function transition point, and corresponds to the second function after the function transition point,
wherein each of the plurality of semiconductor memory devices comprises:
a characteristic information generation part suitable for generating a refresh characteristic information in response to the information about disposition relationships between the controller and the semiconductor memory device; and
a refresh operation part suitable for performing the refresh operation in response to the refresh characteristic information,
wherein the plurality of semiconductor memory devices include a first semiconductor memory device and a second semiconductor memory device, and the first semiconductor memory device is disposed with a first space with reference to the controller, and the second semiconductor memory device is disposed with a second space with reference to the controller,
wherein when the second space is greater than the first space,
one of the function transition points of the first semiconductor memory device is set to a first temperature, and
one of the function transition points of the second semiconductor memory device is set to a second temperature, which is higher than the first temperature.

8. The semiconductor memory system of claim 7,
wherein the controller and each of the plurality of semiconductor memory devices are separately disposed, and
wherein the function transition points of the plurality of semiconductor memory devices are different from one another.

9. The semiconductor memory system of claim 7, wherein the refresh operation part comprises:
an oscillating signal generation section suitable for generating an oscillation signal oscillating with a period, which is defined by a predetermined temperature-period function;
a period control section suitable for controlling the period of the oscillation signal according to the combination of two or more predetermined temperature-period functions, which are different from one another, in response to the refresh characteristic information; and
a memory cell array suitable for performing the refresh operation in response to the oscillation signal.

10. A semiconductor memory device comprising:
a detection part suitable for detecting a number of accesses to the semiconductor memory device;
a characteristic information generation part suitable for generating a refresh characteristic information in response to an output signal of the detection part; and
a refresh operation part suitable for setting one or more function transition points in response to the refresh characteristic information, and performing a refresh operation according to a combination of two or more predetermined temperature-period functions, which are different from one another, with reference to the function transition point,
wherein the combined temperature-period function has two or more temperature sections defined by the function transition points, and
wherein the combined temperature-period function has each of the two or more temperature-period functions including a first function and a second function, which are different from one another, in each of the temperature sections,
wherein the combined temperature-period function corresponds to the first function before a function transition point, and corresponds to the second function after the function transition point,
wherein the refresh operation part comprises:
an oscillating signal generation section suitable for generating an oscillation signal oscillating with a period, which is defined by a predetermined temperature-period function;
a period control section suitable for controlling the period of the oscillation signal according to the combination of two or more predetermined temperature-period functions, which are different from one another, in response to the refresh characteristic information; and
a memory cell array suitable for performing the refresh operation in response to the oscillation signal,
wherein the period control section includes a plurality of diodes and a plurality of transistors for electrically coupling to the oscillating signal generation section for defining the slopes of the first function and the second function.

11. The semiconductor memory device of claim 10, wherein the detection part detects the number of accesses through a temperature of the semiconductor memory device.

12. The semiconductor memory device of claim 10, wherein the detection part detects the number of accesses through an input number of a command signal inputted to the semiconductor memory device.

* * * * *